(12) United States Patent
Kang et al.

(10) Patent No.: US 8,014,187 B2
(45) Date of Patent: Sep. 6, 2011

(54) METHOD FOR DRIVING PHASE CHANGE MEMORY DEVICE

(75) Inventors: Hee Bok Kang, Chungcheongbuk-do (KR); Suk Kyoung Hong, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 367 days.

(21) Appl. No.: 12/127,988

(22) Filed: May 28, 2008

(65) Prior Publication Data

US 2009/0027975 A1    Jan. 29, 2009

(30) Foreign Application Priority Data

Jul. 24, 2007 (KR) .................. 10-2007-0073850

(51) Int. Cl.
*G11C 11/00* (2006.01)
*G11C 13/00* (2006.01)
(52) U.S. Cl. ............... 365/148; 365/151; 365/163
(58) Field of Classification Search .......... 365/148, 365/151, 163
See application file for complete search history.

(56) References Cited

U.S. PATENT DOCUMENTS

| | | | | |
|---|---|---|---|---|
| 7,149,103 | B2* | 12/2006 | Ahn | 365/148 |
| 7,321,503 | B2* | 1/2008 | Joo et al. | 365/148 |
| 7,333,363 | B2* | 2/2008 | Nakai et al. | 365/151 |
| 7,440,316 | B1* | 10/2008 | Lee et al. | 365/163 |
| 7,443,721 | B2* | 10/2008 | Kurotsuchi et al. | 365/163 |
| 7,609,544 | B2* | 10/2009 | Osada et al. | 365/163 |
| 7,643,328 | B2* | 1/2010 | Tamura et al. | 365/148 |
| 7,643,336 | B2* | 1/2010 | Kang et al. | 365/163 |
| 7,646,633 | B2* | 1/2010 | Fuji | 365/163 |

FOREIGN PATENT DOCUMENTS

| | | | |
|---|---|---|---|
| KR | 2007-0005823 A | 1/2007 | |
| WO | 2007/046130 A1 | 4/2007 | |

* cited by examiner

*Primary Examiner* — Trong Phan
(74) *Attorney, Agent, or Firm* — Ladas & Parry LLP

(57) ABSTRACT

A method is disclosed for driving a phase change memory device including a phase change resistor. The method includes applying a trigger voltage to the phase change resistor for a first write time to preheat the phase change resistor, applying a first write voltage to the phase change resistor for a second write time to control a first state of the phase change resistor, and applying a second voltage to the phase change resistor for a third write time to control a second state of the phase change resistor.

18 Claims, 9 Drawing Sheets

METHOD FOR DRIVING PHASE CHANGE MEMORY DEVICE

This application is based upon and claims the benefit of priority to Korean Patent Application No. 10-2007-73850, filed on Jul. 24, 2007, the entire contents of which are incorporated herein by reference.

BACKGROUND

Embodiments consistent with the present invention relate to a method for driving a phase change memory device and, more specifically, to a technology of effectively controlling set/reset currents in a nonvolatile memory device using a phase change resistance cell.

A nonvolatile memory including a magnetic memory and a phase change memory (PCM) has a data processing speed similar to that of a volatile Random Access Memory (RAM). However, in contrast to a volatile RAM, a nonvolatile memory may conserve data even after the power is turned off.

FIGS. 1a and 1b are diagrams illustrating a conventional phase change resistor (PCR) 4.

PCR 4 comprises a phase change material (PCM) 2 inserted between a top electrode 1 and a bottom electrode 3. When a voltage and a current are applied to PCR 4, a high temperature is generated in PCM 2 so that an electric conductive state of PCR 4 is changed depending on the resistance of PCM 2. PCM 2 may comprise AgLnSbTe. PCM 2 may also comprise chalcogenide having chalcogen elements (S, Se, Te) as a main ingredient, for example, a germanium antimonic tellurium consisting of Ge—Sb—Te.

FIGS. 2a and 2b are diagrams illustrating the working principle of conventional PCR 4.

As shown in FIG. 2a, PCM 2 can be crystallized when a low current of less than a threshold value flows through PCR 4. As a result, PCM 2 is crystallized to become a low resistance material.

As shown in FIG. 2b, PCM 2 has a temperature higher than its melting point, when a high current of more than a threshold value flows through PCR 4. As a result, PCM 2 becomes a high resistance material in an amorphous phase.

In this way, PCR 4 is configured to store nonvolatile data corresponding to the two resistance states. Data "1" refers to a low resistance state of PCR 4, and data "0" refers to a high resistance state of PCR 4, so that the logic states of the two data types can be stored.

FIG. 3 is a diagram illustrating a write operation of a conventional phase change resistance cell.

Heat is generated when a current flows through top electrode 1 and bottom electrode 3 of PCR 4 for a given time. As a result, a state of PCM 2 is changed to be crystalline or amorphous depending on the amount of current applied to top electrode 1 and bottom electrode 3.

When a low current flows between top electrode 1 and bottom electrode 3 for a given time, PCM 2 becomes crystalline by a low temperature heating state, so that PCR 4, which has a low resistance, is at a set state. On the other hand, when a high current flows between top electrode 1 and bottom electrode 3 for a given time, PCM 2 becomes amorphous by a high temperature heating state, so that PCR 4, which has a high resistance, is at a reset state. The two phases may be differentiated by the change of the electric resistance of PCR 4.

A low voltage is applied to PCR 4 for a long time in order to write the set state in a write mode. On the other hand, a high voltage is applied to PCR 4 for a short time in order to write the reset state in the write mode.

In order to write the reset state into the phase change resistance cell, a high pumping voltage VPP is used as a write voltage. Pumping voltage VPP is generated using a boosting circuit in a chip.

However, in the conventional reset voltage applying method, pumping voltage VPP is applied in the write mode since an initial stage of the operation. As a result, the generation of pumping voltage VPP consumes a large amount of power.

SUMMARY

Disclosed is a method for driving a phase change memory device to control a reset current with reduced electric power.

Various embodiments are directed to reducing an area of a boosting circuit and decreasing the power consumption of a phase change memory device.

According to one embodiment consistent with the present invention, a method for driving a phase change memory device including a phase change resistor is disclosed. The method includes applying a trigger voltage to the phase change resistor for a first write time to preheat the phase change resistor, applying a first write voltage to the phase change resistor for a second write time to control the phase change resistor at a first state, and applying a second write voltage to the phase change resistor for a third write time to control the phase change resistor at a second state.

According to another embodiment consistent with the present invention, a method for driving a phase change memory device including a phase change resistance cell arranged at an intersection of a word line and a bit line is disclosed. The method includes, for a first write time, applying a ground voltage to the word line and applying a trigger voltage to the bit line to preheat the phase change resistance cell, and for a second write time, applying the ground voltage to the word line and a first write voltage to the bit line to supply a set current to the phase change resistance cell.

According to yet another embodiment consistent with the present invention, a method for driving a phase change memory device including a phase change resistor is disclosed. The method includes applying a trigger voltage to the phase change resistor for a first write time to preheat the phase change resistor, applying a first write voltage to the phase change resistor for a second write time to control the phase change resistor at a first state, the first write voltage decreasing in a stepwise manner during the second write time, and applying a second write voltage to the phase change resistor for a third write time to control the phase change resistor at a second state.

According to still another embodiment consistent with the present invention, a method for driving a phase change memory device including a phase change resistance cell disposed at an intersection of a word line and a bit line is disclosed. The method includes, for a first write time, applying a ground voltage to the word line and applying a trigger voltage to the bit line to preheat the phase change resistance cell, for a second write time, applying the ground voltage to the word line and applying a first write voltage to the bit line to supply a set current to the phase change resistance cell, for a third write time, applying the ground voltage to the word line and applying a voltage lower than the first write voltage to the bit line, the voltage lower than the first write voltage decreasing in a stepwise manner during the third write time, and applying a power voltage to the word line and applying the ground voltage to the bit line.

DETAILED DESCRIPTION

Figure 1A:
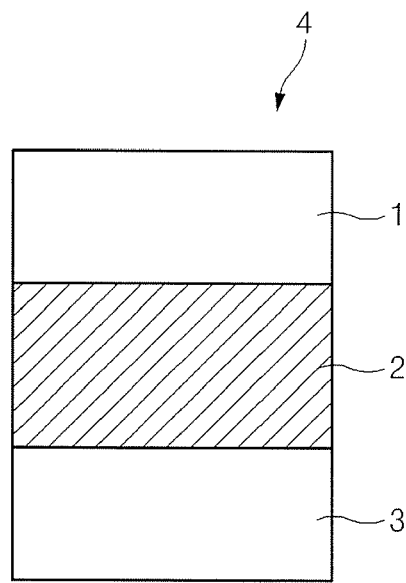
FIGS. 1a and 1b are diagrams illustrating two operating states of a conventional phase change resistor.
Figure 1B:
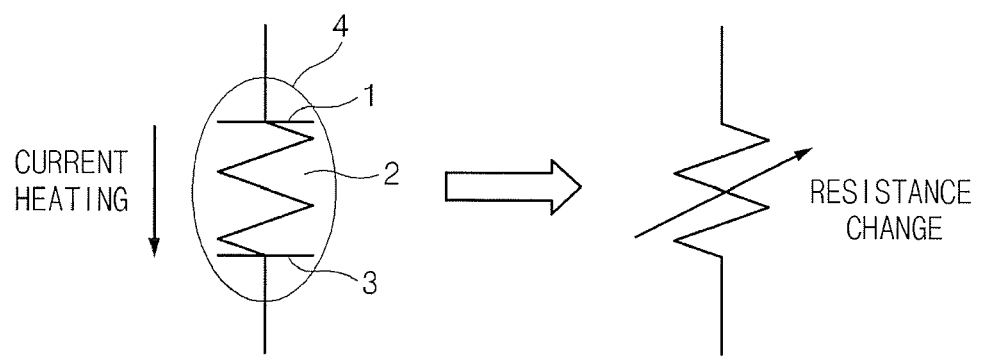
Figure 2A:
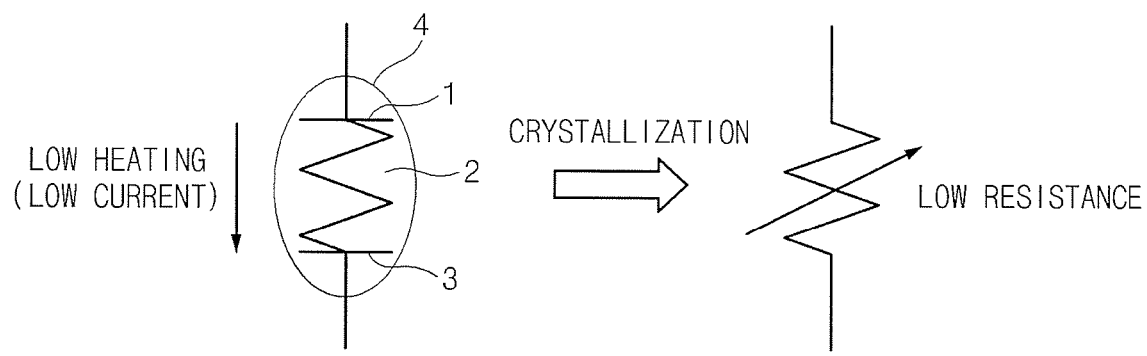
FIGS. 2a and 2b are diagrams illustrating the working principle of a conventional phase change resistor.
Figure 2B:
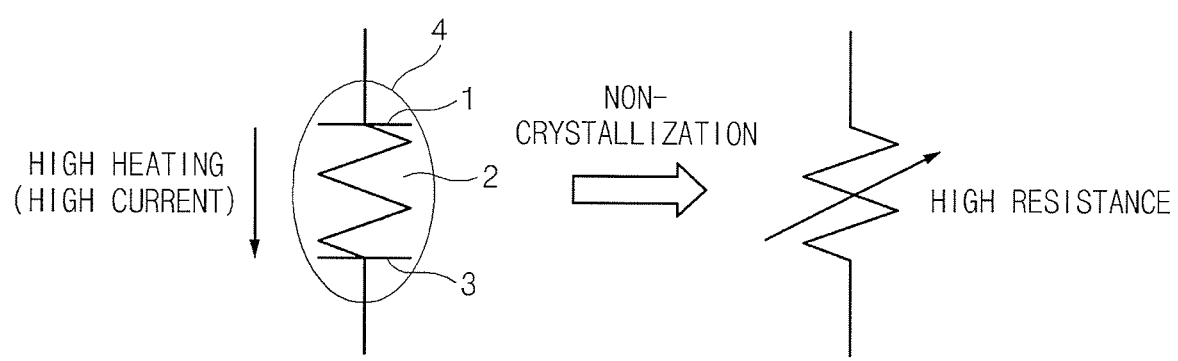
Figure 3:
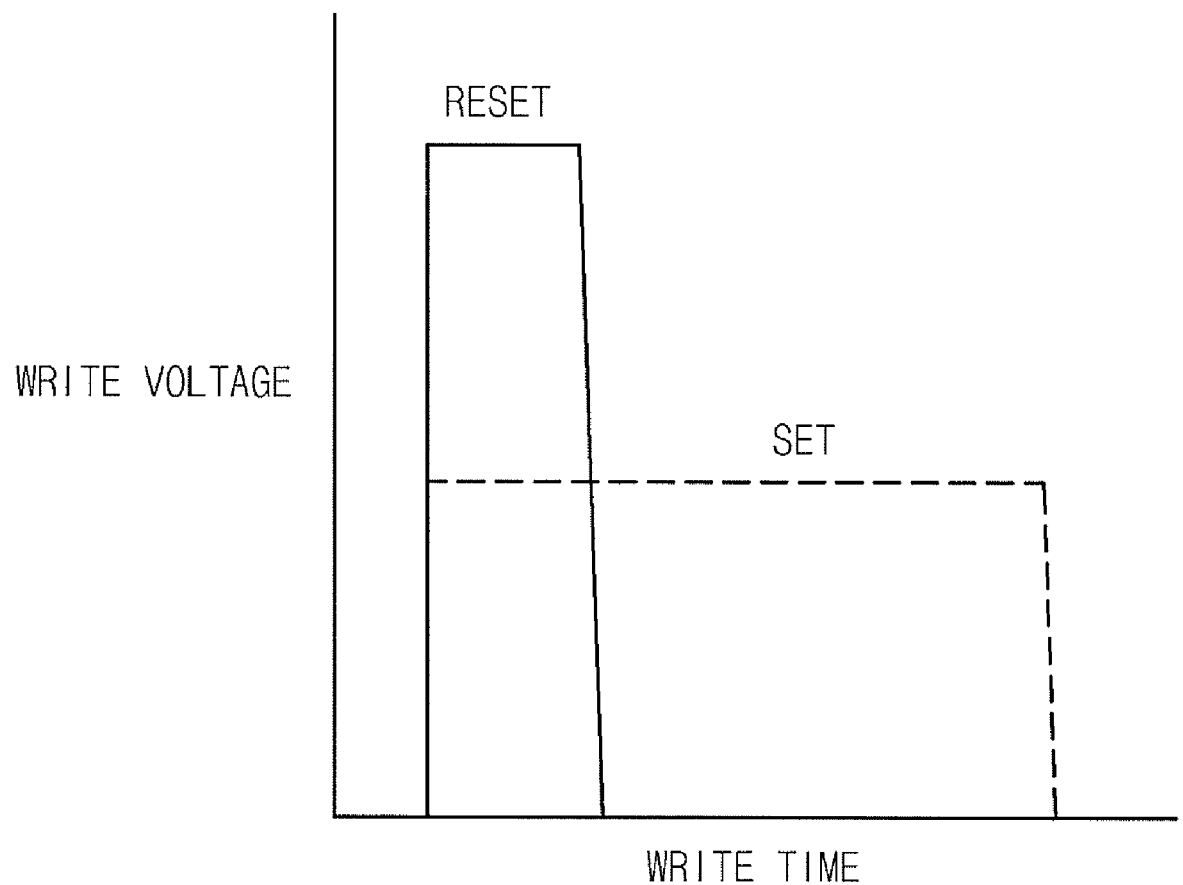
FIG. 3 is a diagram illustrating the write operation of a conventional phase change resistance cell.
Figure 4:
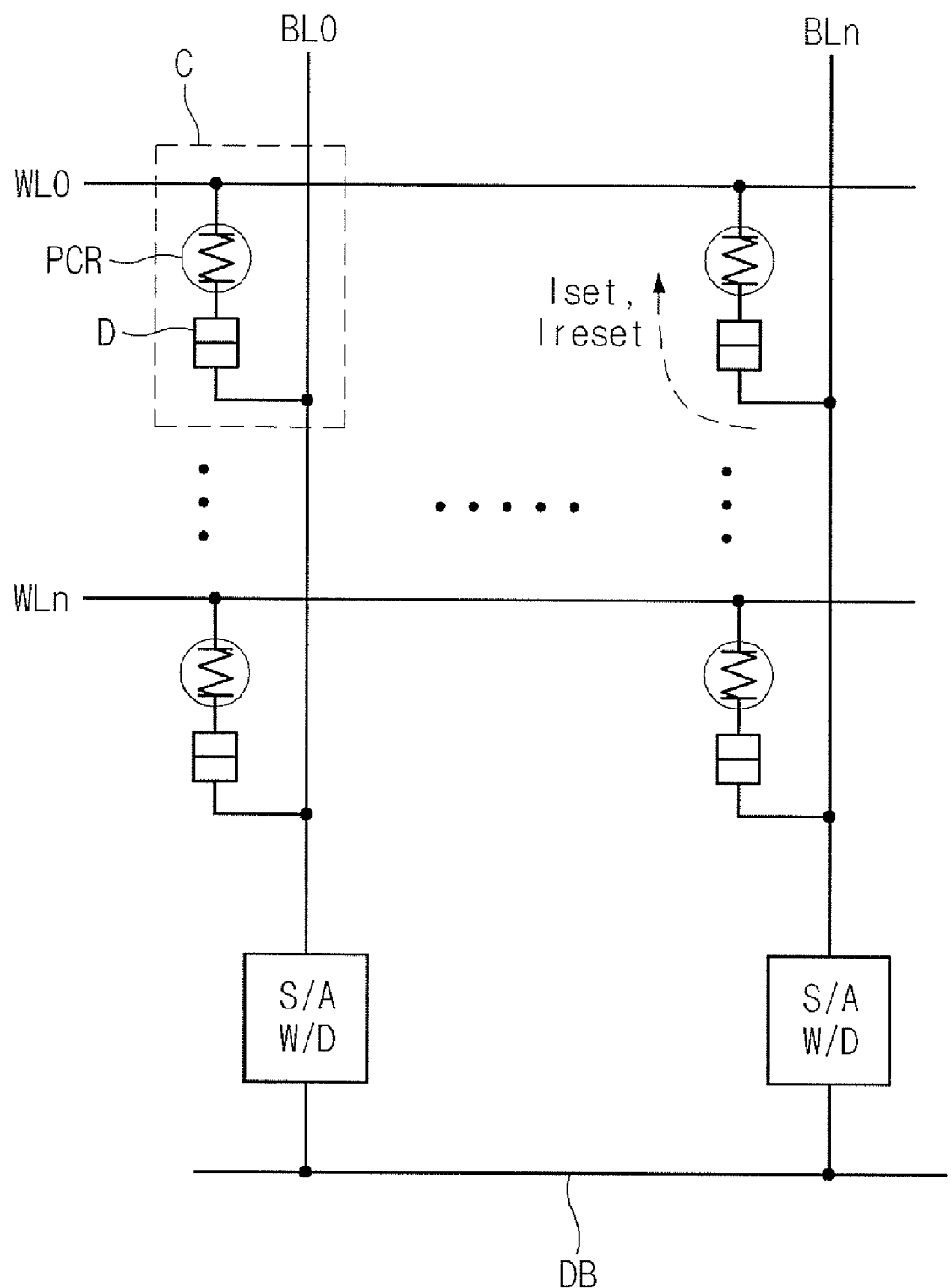
FIG. 4 is a diagram illustrating a phase change memory consistent with the present invention.

FIG. 4 is a diagram illustrating a phase change memory consistent with the present invention.

As shown in FIG. 4, a phase change memory device includes a plurality of unit cells C positioned at the intersections of a plurality of bit lines BL0~BLn and a plurality of word lines WL0~WLn. Unit cell C may include a phase change resistor PCR and a diode D. Diode D may include a PN diode element.

Phase change resistor PCR has a first electrode connected to word line WL and a second electrode connected to an N-type region of diode D. Phase change resistor PCR may include a phase change material located in a region between the first electrode and the second electrode. Further, a P-type region of diode D is connected to bit line BL.

A low voltage may be applied to a selected word line WL in a read mode. A read voltage Vread may be applied to bit line BL, so that a read current Iset having a set state or a read current Ireset having a reset state may flow towards word line WL through bit line BL, diode D, and phase change resistor PCR.

A sense amplifier S/A senses cell data transmitted through bit line BL, and compares the cell data with a reference voltage (ref) to distinguish data "1" from data "0". A write driving unit W/D supplies a driving voltage corresponding to write data to bit line BL when data are written in a unit cell C. Sense amplifier S/A and write driving unit W/D are connected to a data bus DB.

Figure 5:
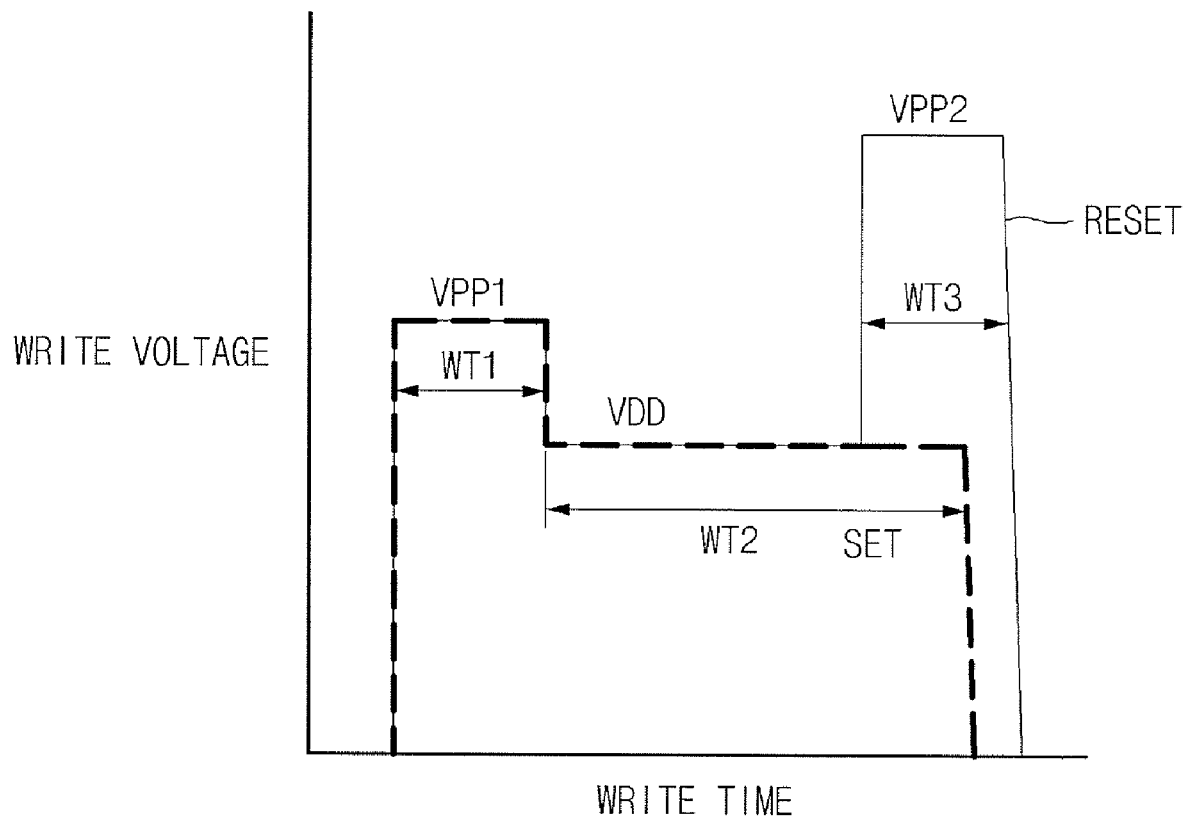
FIG. 5 is a diagram illustrating a method for driving a phase change memory device consistent with the present invention.

FIG. 5 is a diagram illustrating a method for driving a phase change memory device consistent with the present invention.

Because heat may be generated when a current flows between the first electrode and the second electrode of phase change resistor PCR for a given time, phase change material PCM may change phase, e.g., from crystalline to amorphous, or vice versa, depending on the temperature between the first electrode and the second electrode.

In a write mode, an operating voltage for writing a set state is applied to a phase change resistance cell at an initial stage. That is, when a low current flows through phase change resistor PCR for a given write time WT2, phase change material PCM may be heated and become crystalline by a low heat generated by the low current. As a result, phase change resistor PCR, which is a resistor of low resistance, is heated at a set temperature.

A high voltage VPP1 may be applied to phase change resistor PCR at the initial stage of the write mode for a given write time WT1, thereby preheating phase change resistor PCR. High voltage VPP1 corresponds to a trigger voltage, and thus has a voltage level higher than that of a power voltage VDD and lower than that of a pumping voltage VPP2. After write time WT1, power voltage VDD is applied to phase change resistor PCR for write time WT2.

A write voltage for writing the set state uses an external voltage or a lower voltage to reduce power consumption while the write voltage is generated.

That is, at the initial stage for writing the set state, high voltage VPP1, which may heat phase change resistor PCR to above the melting temperature of phase change material PCM, is applied to phase change resistor PCR. In this case, a current is increased while the resistance value of phase change resistor PCR is reduced. As a result, when high voltage VPP1, which is a trigger voltage, is applied to phase change resistor PCR for write time WT1 to preheat phase change resistor PCR, the write voltage having the set state is applied with a low current to generate a high heat.

When an operating voltage for writing the set state is applied to phase change resistor PCR to heat phase change resistor PCR, pumping voltage VPP2 is applied to phase change resistor PCR to increase the write voltage, so as to achieve a reset temperature.

The write voltage increases to high voltage VPP1 and power voltage VDD level for a write time (WT1+WT2) required to transmit the write voltage having the set state. As a result, pumping voltage VPP2 is boosted with write voltages VPP1 and VDD having the set state boosted over a given voltage level.

When the write voltage having a reset state is applied to phase change resistor PCR, the write voltage rises from power voltage VDD level to pumping voltage VPP2 level. As a result, it is possible to control a short write time WT3 for applying a reset pulse having pumping voltage VPP2 level. The write voltage increases from power voltage VDD level to pumping voltage VPP2 level, thereby reducing the power consumption for the generation of pumping voltage VPP2.

When a high current flows through phase change resistor PCR for write time WT3, phase change material PCM may become crystalline by the high heating state, so that phase change resistor PCR, which has a high resistance, is at the reset state. As a result, the two phases may be differentiated by the change of the electric resistance of phase change resistor PCR.

That is, in the write mode, a low voltage is applied to phase change resistor PCR to write the set state at the initial stage for write time (WT1+WT2). In order to write the reset state in the write mode, a high voltage is applied to phase change resistor PCR for write time WT3.

A waveform of the write voltage having the set state is disabled earlier than that of the write voltage having the reset state. Write time (WT1+WT2) required to apply the write voltage having the set state is longer than write time WT3 required to apply the write voltage having the reset state.

In order to write the set/reset states to phase change resistor PCR, high voltage VPP1 and pumping voltage VPP2 are used as write voltages. High voltage VPP1 and pumping voltage VPP2 pump power voltage VDD using a boosting circuit in a chip.

Figure 6:
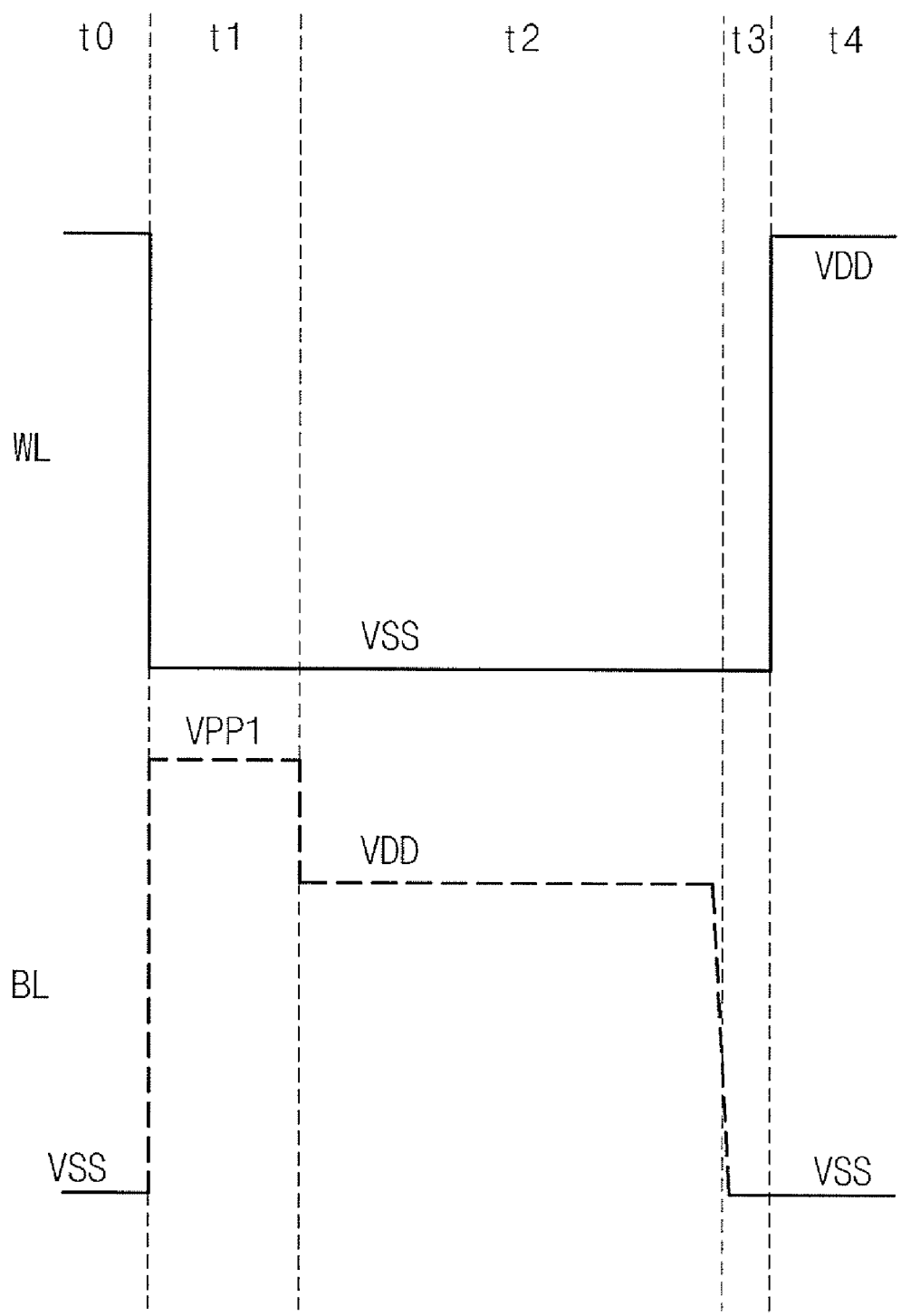
FIG. 6 is a waveform diagram of a set mode write operation of FIG. 5.

FIG. 6 is a waveform diagram of a set mode write operation of FIG. 5.

In a time period t0, word line WL is kept at power voltage VDD level, and bit line BL is kept at a ground voltage VSS level. As a result, a current path is not formed in a phase change resistance cell C.

In a time period t1, word line WL transits from power voltage VDD level to ground voltage VSS level. Bit line BL transits from ground voltage VSS level to high voltage VPP1 level.

A voltage level of a bit line BL0, for example, is synchronized with voltage levels of other bit lines BL1~BLn, when the voltage level transits to high voltage VPP1 level, so that a current path is formed through bit line BL, diode D, and phase change resistor PCR. As a result, set current Iset flows through word line WL.

In a time period t2, word line WL is kept at ground voltage VSS level. Bit line BL transits from high voltage VPP1 level to power voltage VDD level.

The voltage level of a bit line BL0, for example, is synchronized with voltage levels of other bit lines BL1~BLn, when the voltage level transits to power voltage VDD level, so that a current path is formed through bit line BL, diode D, and phase change resistor PCR. As a result, set current Iset flows through word line WL.

In a time period t3, word line WL is kept at ground voltage VSS level. Bit line BL transits from power voltage VDD level to ground voltage VSS level.

The flowing of set current Iset is controlled in synchronization with a disabling time of the bit line current. That is, set current Iset is synchronized with the bit line current, when set current Iset flows in phase change resistance unit cell C.

As a result, set current Iset is restricted to have a low value to reduce the temperature dropping speed for phase change resistance unit cell C, so that it is possible to have a sufficient heating time until phase change resistor becomes crystalline at a low heating state.

In a time period t4, word line WL transits from ground voltage VSS level to power voltage VDD level. Bit line BL is kept at ground voltage VSS level. As a result, word line WL transits to power voltage VDD level to disconnect the current path of phase change resistance unit cell C.

Figure 7:
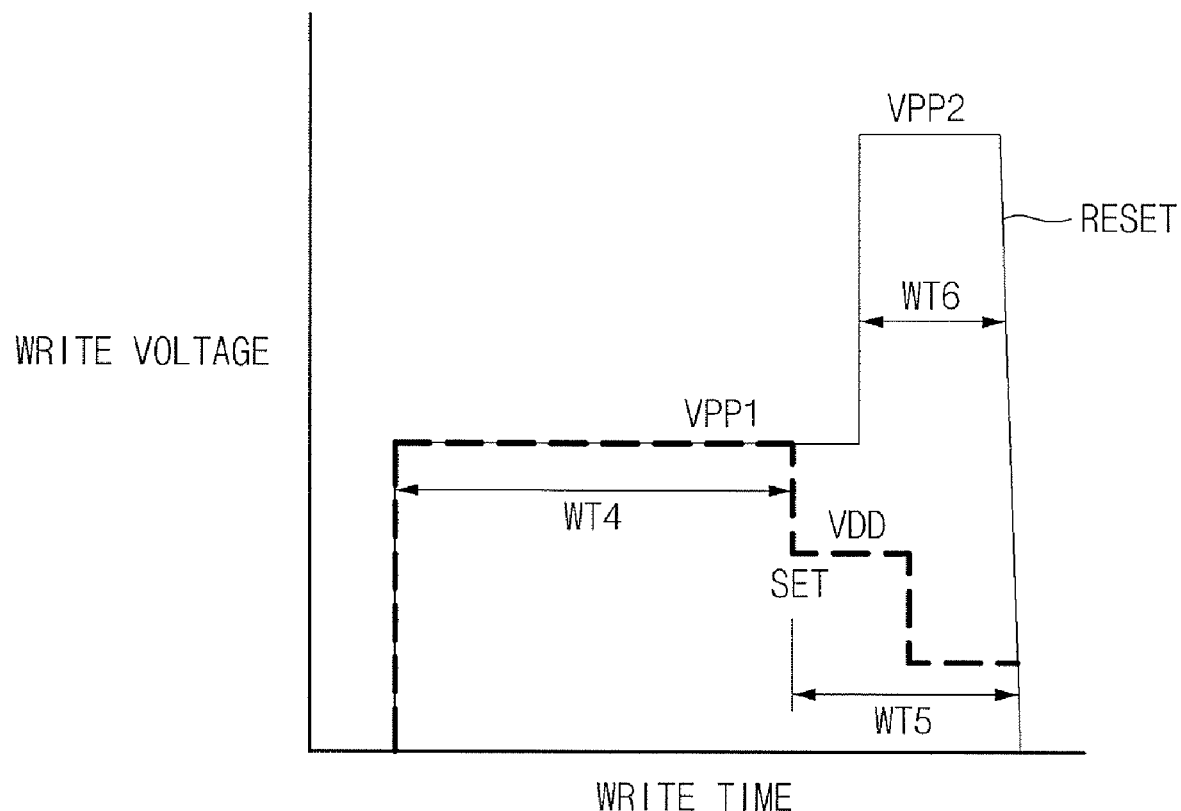
FIG. 7 is a diagram illustrating a method for driving a phase change memory device consistent with the present invention.

FIG. 7 is a diagram illustrating a method for driving a phase change memory device consistent with the present invention.

In a write mode, an operating voltage for writing the set state is applied to phase change resistance unit cell C at an initial stage. That is, in order to heat phase change resistor PCR, a write voltage flows through phase change resistor PCR for a given write time WT4. High voltage VPP1 as a write voltage is applied to phase change resistor PCR at the initial stage of the write mode to preheat phase change resistor PCR.

High voltage VPP1, which corresponds to a trigger voltage, has a level higher than that of power voltage VDD and lower than that of pumping voltage VPP2.

After write time WT4, a stepwise reducing current flows through phase change resistor PCR for a given write time WT5 to heat phase change resistor PCR, so that phase change material PCM becomes crystalline by the low heating state.

After power voltage VDD lower than high voltage VPP1 is applied to phase change resistor PCR for a given time during write time WT5, a voltage lower than power voltage VDD is then applied to phase change resistor PCR. As a result, phase change resistor PCR, which is a low resistance resistor, is heated at a set temperature.

The write voltage for writing the set state uses an external voltage or a lower voltage, thereby reducing the power consumption for generation of the write voltage.

An operating voltage for writing the set state is applied to phase change resistor PCR to heat phase change resistor PCR. After write time WT4, pumping voltage VPP2 is applied to phase change resistor PCR to increase the write voltage to achieve a reset temperature.

During write time WT4 required to apply the write voltage having the set state, the write voltage is increased to high voltage VPP1 level. As a result, pumping voltage VPP2 is boosted with write voltage VPP1 having the set state boosted to above a given voltage level.

When the write voltage having the reset state is applied to phase change resistor PCR, the write voltage increases from high voltage VPP1 level to pumping voltage VPP2 level, so that a write time WT6 for transmitting a reset pulse at pumping voltage VPP2 level can be controlled to be short. The write voltage increases from high voltage VPP1 level to pumping voltage VPP2 level, thereby reducing the power consumption required to generate pumping voltage VPP2.

When a high current flows through phase change resistor PCR during write time WT6, phase change material PCM becomes amorphous by a high heating state, so that phase change resistor PCR is reset. As a result, the two phases may be differentiated by the change of the electric resistance of phase change resistor PCR.

In order to write the set state at the initial stage of the write mode, a low voltage is applied to phase change resistor PCR for a write time (WT4+WT5). In order to write the reset state in the write mode, a high voltage is applied to phase change resistor PCR for a shorter write time WT6.

A waveform of the write voltage having the set state is disabled earlier than that of the write voltage having the reset state. The waveform of the write voltage having the set state becomes lower step by step. Write time (WT4+WT5) of the write voltage having the set state is longer than write time WT6 of the write voltage having the reset state.

In order to write the set/reset states into phase change resistor PCR, high voltage VPP1 and pumping voltage VPP2 are used as write voltages. High voltage VPP1 and pumping voltage VPP2 pump power voltage VDD using a boosting circuit in a chip.

Figure 8:
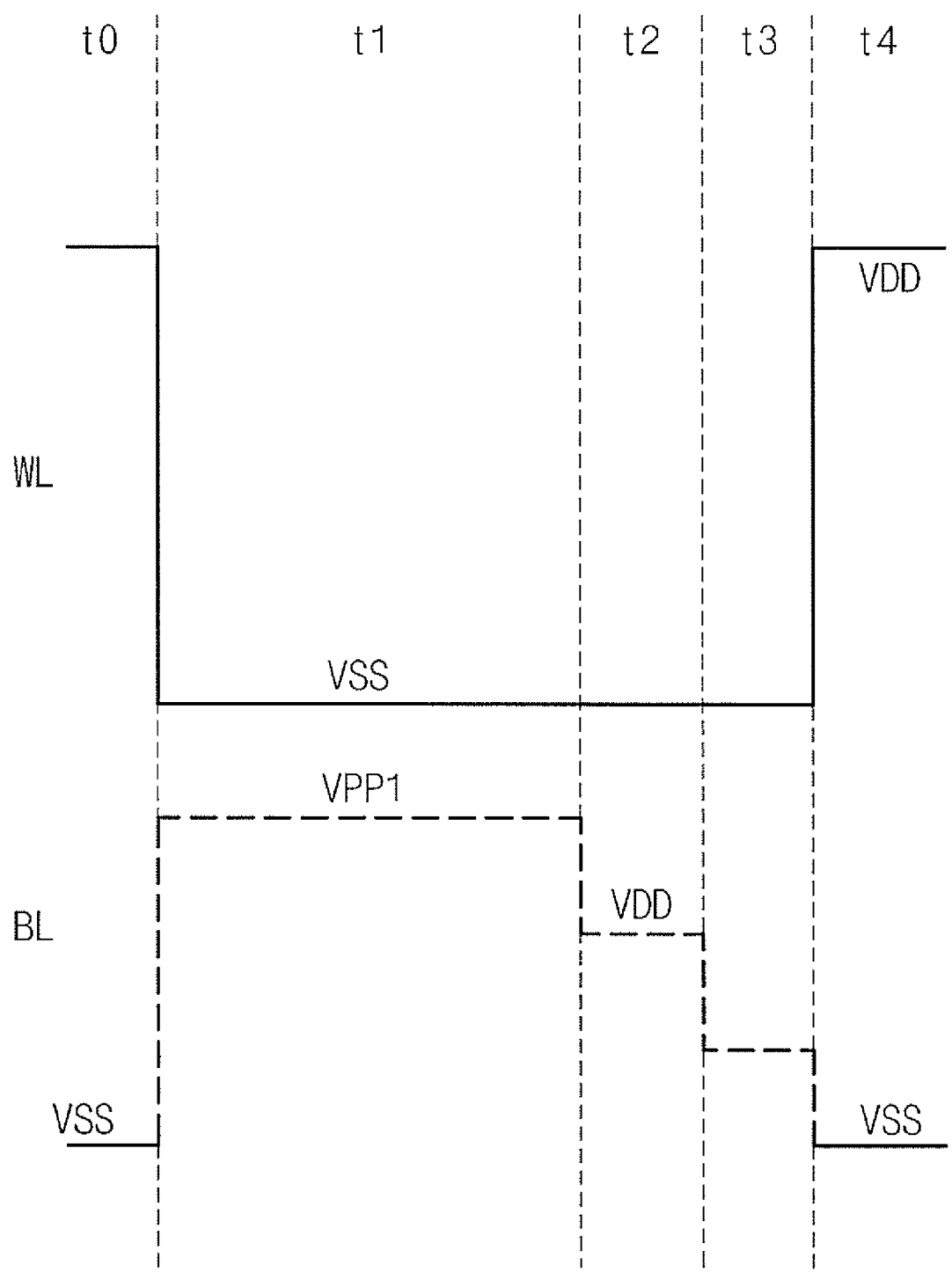
FIG. 8 is a waveform diagram of a set mode write operation of FIG. 7.

FIG. 8 is a waveform diagram of a set mode write operation of FIG. 7.

In a time period t0, word line WL is kept at power voltage VDD level, and bit line BL is kept at ground voltage VSS level. As a result, a current path is not formed in phase change resistance cell C.

In a time period t1, word line WL transits from power voltage VDD level to ground voltage VSS level. Bit line BL transits from ground voltage VSS level to high voltage VPP1 level.

A voltage level of a bit line BL0, for example, is synchronized with voltage levels of other bit lines BL1~BLn, when the voltage level transits from ground voltage VSS level to high voltage VPP1 level, so that a current path is formed through bit line BL, diode D, and phase change resistor PCR. As a result, set current Iset flows through word line WL.

In a time period t2, word line WL is kept at ground voltage VSS level. Bit line BL transits from high voltage VPP1 level to power voltage VDD level.

The voltage level of a bit line BL0, for example, is synchronized with voltage levels of other bit lines BL1~BLn, when the voltage level transits to power voltage VDD level, so that a current path is formed through bit line BL, diode D, and phase change resistor PCR. As a result, set current Iset flows through word line WL.

In a time period t3, word line WL is kept at ground voltage VSS level. Bit line BL transits, step by step, from power voltage VDD level to a voltage level lower than power voltage VDD level. A waveform in bit line BL is disabled earlier than that of word line WL. Bit line BL has a step waveform which transits step by step to a lower voltage.

The flowing of set current Iset is controlled in synchronization with a disabling time of the bit line current. That is, set current Iset is synchronized with a bit line current, when set current Iset flows in phase change resistance unit cell C.

As a result, set current Iset is restricted to have a low value to reduce the temperature dropping speed for phase change resistance unit cell C, so that it is possible to have a sufficient heating time until phase change resistor PCR becomes crystalline at a low heating state.

In a time period t4, word line WL transits from ground voltage VSS level to power voltage VDD level. Bit line BL is kept at ground voltage VSS level. As a result, word line WL transits to power voltage VDD level to disconnect the current path of phase change resistance unit cell C.

Figure 9:
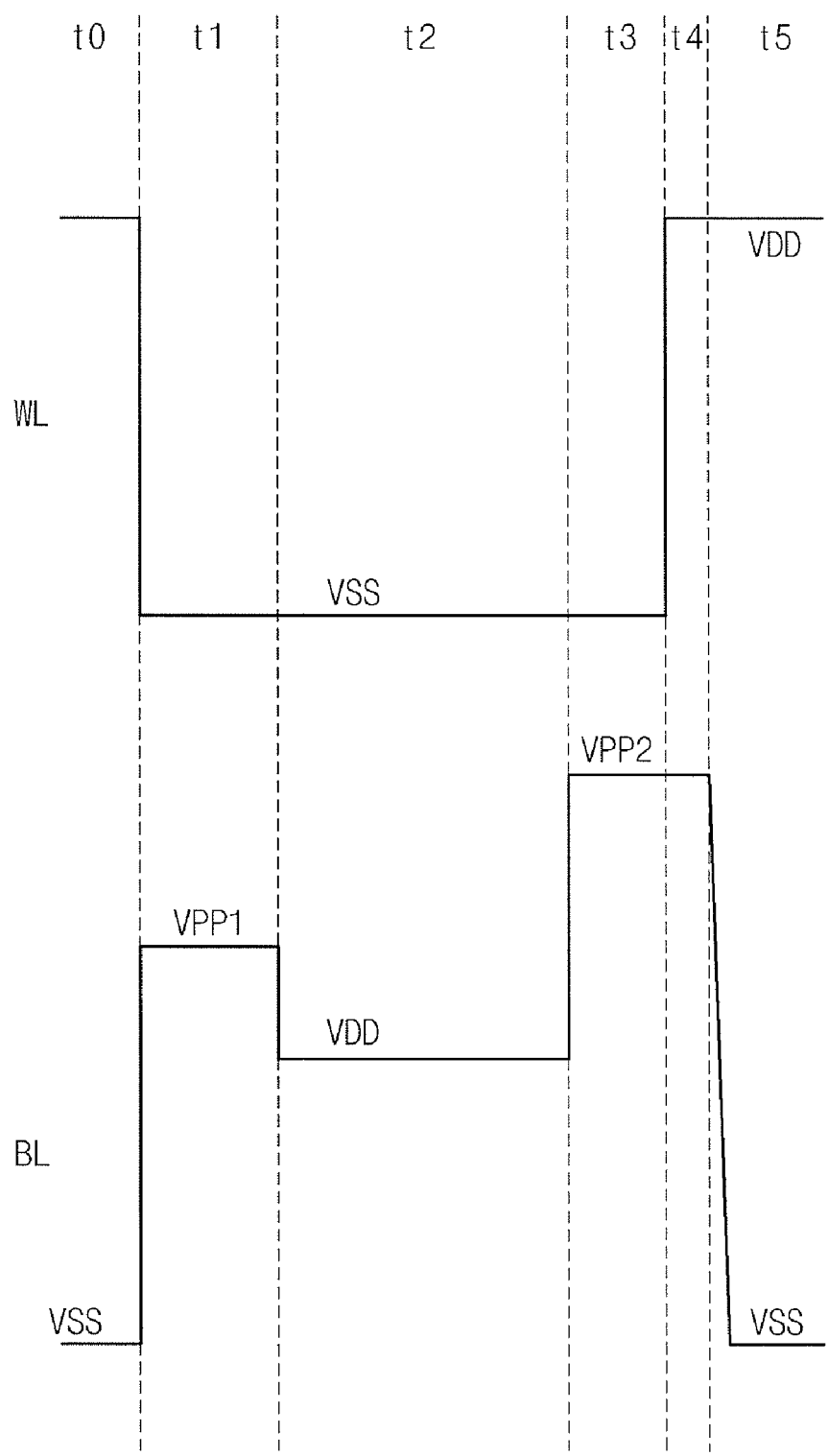
FIG. 9 is a waveform diagram of a reset mode write operation of a phase change memory device consistent with the present invention.

FIG. 9 is a waveform diagram of a reset mode write operation of a phase change memory device consistent with the present invention.

In a time period t0, word line WL is kept at power voltage VDD level, and bit line BL is kept at ground voltage VSS level. As a result, a current path is not formed in phase change resistance unit cell C.

In a time period t1, word line WL transits from power voltage VDD level to ground voltage VSS level. Bit line BL transits from ground voltage VSS level to high voltage VPP1 level.

A voltage level of bit line BL0, for example, is synchronized with voltage levels of other bit lines BL1~BLn, when the voltage level transits to high voltage VPP1 level, so that a current path is formed through bit line BL, diode D, and phase change resistor PCR. As a result, set current Iset flows through word line WL.

In a time period t2, word line WL is kept at ground voltage VSS level. Bit line BL transits from high voltage VPP1 level to power voltage VDD level.

The voltage level of bit line BL0, for example, is synchronized with voltage levels of other bit lines BL1~BLn, when the voltage level transits to power voltage VDD level, so that a current path is formed through bit line BL, diode D, and phase change resistor PCR. As a result, set current Iset flows through word line WL.

In a time period t3, word line WL is kept at ground voltage VSS level. Bit line BL transits from power voltage VDD level to pumping voltage VPP2 level.

That is, when operating voltage VDD for writing the set state is applied to phase change resistor PCR to sufficiently heat phase change resistor PCR, pumping voltage VPP2 is applied to phase change resistor PCR to increase the write voltage to achieve the reset temperature.

In time periods t3 and t4, when a high current flows, phase change material PCM become amorphous by a high heating state, so that phase change resistor PCR, which is a high resistance resistor, is in a reset state.

In time period t4, word line WL transits from ground voltage VSS level to power voltage VDD level. Bit line BL is kept at pumping voltage VPP2 level. As a result, word line WL transits to power voltage VDD level to disconnect a current path of phase change resistance unit cell C.

In a time period t5, word line WL is kept at power voltage VDD level, and bit line BL transits from pumping voltage VPP2 level to ground voltage VSS level.

As described above, a method consistent with the present invention can control a reset current with small electric power using set/reset driving voltages to reduce an area of a boosting circuit and to decrease power consumption.

Although a number of illustrative embodiments consistent with the present invention has been described, it should be understood that numerous other modifications and embodiments can be devised by those skilled in the art that will fall within the spirit and scope of the appended claims. Moreover, a number of variations and modifications are possible in the component parts and/or arrangements of the subject combinations. In addition to variations and modifications in the component parts and/or arrangements, alternative uses will also be apparent to those skilled in the art.

What is claimed is:

1. A method for driving a phase change memory device including a phase change resistor, the method comprising:
    applying a trigger voltage to the phase change resistor for a first write time to preheat the phase change resistor;
    applying a first write voltage to the phase change resistor for a second write time to control the phase change resistor at a first state; and
    applying a second write voltage to the phase change resistor for a third write time to control the phase change resistor at a second state, wherein a value of the trigger voltage is the same for both the first and second states, and wherein the trigger voltage having a voltage level higher than that of the first write voltage and lower than that of the second write voltage.

2. The method according to claim 1, wherein the first write voltage has a power voltage level.

3. The method according to claim 1, wherein the second write voltage has a pumping voltage level.

4. The method according to claim 1, wherein the second write voltage has a voltage level higher than that of the first write voltage.

5. The method according to claim 1, wherein a sum of the first write time and the second write time is greater than the third write time.

6. The method according to claim 1, wherein the second write time is greater than the first write time.

7. The method according to claim 1, wherein the first state is a set state.

8. The method according to claim 1, wherein the second state is a reset state.

9. The method according to claim 1, wherein the applying the trigger voltage comprises preheating the phase change resistor above a melting temperature thereof.

10. The method according to claim 1, wherein the trigger voltage is provided by a boosting circuit.

11. The method according to claim 1, wherein the phase change memory device includes a phase change resistance cell arranged at an intersection of a word line and a bit line.

12. The method according to claim 11, wherein the applying the trigger voltage comprises:
    applying a ground voltage to the word line and applying the trigger voltage to the bit line.

13. The method according to claim 11, wherein the applying the first write voltage comprises:
    applying a ground voltage to the word line and the first write voltage to the bit line to supply a set current to the phase change resistance cell.

14. The method according to claim 13, wherein the first write voltage decreases in a stepwise manner during the second write time.

15. The method according to claim 14, further comprising:
    applying a power voltage to the word line and ground voltage to the bit line.

16. The method according to claim 11, wherein the applying the second write voltage comprises:
applying a ground voltage to the word line and applying the second write voltage to the bit line to supply a reset current to the phase change resistance cell.

17. The method according to claim 11, further comprising:
applying a power voltage to the word line and applying the second write voltage to the bit line; and
applying the power voltage to the word line and applying the ground voltage to the bit line.

18. The method according to claim 11, wherein a ground voltage is applied to the bit line after the second write voltage is applied.

* * * * *